United States Patent
Neumann (10) Patent No.: US 8,004,322 B2
(45) Date of Patent: Aug. 23, 2011

(54) SYNCHRONIZATION SCHEME WITH ADAPTIVE REFERENCE FREQUENCY CORRECTION

(75) Inventor: Markus Neumann, Nuremberg (DE)

(73) Assignee: ST-Ericsson SA, Plan-les-Ouates (CH)

( * ) Notice: Subject to any disclaimer, the term of this patent is extended or adjusted under 35 U.S.C. 154(b) by 247 days.

(21) Appl. No.: 11/993,625

(22) PCT Filed: Jun. 26, 2006

(86) PCT No.: PCT/IB2006/052085
§ 371 (c)(1),
(2), (4) Date: Aug. 12, 2009

(87) PCT Pub. No.: WO2007/000712
PCT Pub. Date: Jan. 4, 2007

(65) Prior Publication Data
US 2010/0156481 A1    Jun. 24, 2010

(30) Foreign Application Priority Data
Jun. 29, 2005    (EP) .................................... 05105781

(51) Int. Cl.
*H03L 7/06* (2006.01)
(52) U.S. Cl. ........................................ 327/156; 327/147
(58) Field of Classification Search .................. 327/147, 327/156, 158
See application file for complete search history.

(56) References Cited

U.S. PATENT DOCUMENTS

| 4,121,159 A | 10/1978 | Lampert |
| 5,604,468 A * | 2/1997 | Gillig ............................ 331/176 |
| 5,856,766 A | 1/1999 | Gillig et al. |
| 6,178,216 B1 | 1/2001 | Lee |

(Continued)

FOREIGN PATENT DOCUMENTS
GB    2155711A    9/1985
(Continued)

*Primary Examiner* — Lincoln Donovan
*Assistant Examiner* — Adam D Houston
(74) *Attorney, Agent, or Firm* — Robert Iannucci; Seed IP Law Group PLLC (57) ABSTRACT

The present invention relates to an apparatus and method for providing synchronization of an output signal to a synchronization information. The synchronization is accomplished by providing coupling of a correction control information that controls a signal generating means, e.g. a phase locked loop arrangement (30) or a direct digital synthesis arrangement, to its exact frequency to a frequency conversion unit (90) that converts an uncorrected reference frequency to a correct or exact reference frequency. Thereby, the uncorrected reference frequency for the signal generating means (30) can be provided by a simple crystal oscillator (2) without any means for frequency control. The setting of the signal generating means (30) and the frequency conversion unit (90) can be done in a predetermined sequence which enables a user equipment to synchronize its reference frequency to the synchronization information emitted by a communication network.

34 Claims, 5 Drawing Sheets

U.S. PATENT DOCUMENTS

| | | | |
|---|---|---|---|
| 6,856,791 B2 * | 2/2005 | Klemmer | 455/76 |
| 6,876,874 B2 | 4/2005 | Arnaud et al. | |
| 7,248,664 B2 * | 7/2007 | Fast et al. | 375/376 |
| 7,483,678 B2 * | 1/2009 | Rozenblit et al. | 455/73 |
| 7,602,226 B1 * | 10/2009 | Hwang et al. | 327/291 |
| 7,626,462 B1 * | 12/2009 | Hietala et al. | 331/2 |
| 7,760,039 B2 * | 7/2010 | Sutardja | 331/176 |
| 7,768,360 B2 * | 8/2010 | Sutardja | 331/176 |
| 7,768,361 B2 * | 8/2010 | Sutardja | 331/176 |
| 7,786,817 B2 * | 8/2010 | Sutardja | 331/176 |
| 7,812,683 B2 * | 10/2010 | Sutardja | 331/176 |
| 7,847,602 B2 * | 12/2010 | Tignor | 327/105 |
| 2001/0015678 A1 | 8/2001 | Wesolowski | |
| 2002/0010010 A1 | 1/2002 | Arnaud et al. | |
| 2004/0232997 A1 | 11/2004 | Hein et al. | |

FOREIGN PATENT DOCUMENTS

| | | |
|---|---|---|
| JP | 63035017 A | 2/1988 |
| JP | 10285068 A | 10/1998 |
| JP | 2003069426 A | 3/2003 |
| JP | 2005079981 A | 3/2005 |
| WO | 03079548 A1 | 9/2003 |

* cited by examiner

SYNCHRONIZATION SCHEME WITH ADAPTIVE REFERENCE FREQUENCY CORRECTION

The present invention relates to a method and apparatus for providing synchronization of an output signal to a reference signal, to be used for reference frequency synchronization in a mobile terminal, for example.

Radio communication devices require generation of stable operating frequencies in order to function properly. Typically, stability has been obtained by using a crystal oscillator as a reference oscillator to provide a reference frequency. Specifically, local oscillators of radio terminals are phase-locked to the reference frequency. However, crystal oscillators by themselves cannot provide a sufficiently constant frequency to meet the frequency stability requirements of the radio terminal. In particular, the output frequency of a crystal oscillator varies over temperature. Additionally, non-linearities in the control path of the reference oscillator may cause frequency deviations.

Radio terminals may also require frequency correction to precisely center a radio transceiver operating frequency onto a counterpart station (e.g. base station) channel frequency. Frequency deviations may also occur due to Doppler shifts caused by movements of the terminal or due to frequency offsets at the counterpart stations (e.g. base stations). This is accomplished using an automatic frequency control (AFC) mechanism which determines an error between the radio transceiver operating frequency and the counterpart station (e.g. base station) channel frequency and applies a correction signal to the crystal oscillator to alter the reference frequency in order to synchronize the frequency of the radio terminal to the counterpart station (e.g. base station). The frequency error is typically obtained in a baseband circuitry where it is based on digital representation. A Digital-to-Analog-Converter (DAC) is used to obtain an analog control signal. This analog control signal is applied to a varactor diode which changes its capacitance in dependence of the applied voltage and therefore the frequency of the crystal oscillator changes, when the capacitance, that builds the resonance circuit varies. An extensive decoupling-network, consisting of several resistors and capacitors is used to obtain proper and especially low-noise performance.

This prior art solution has the disadvantage of additional cost and space and reduced reliability.

Moreover this analog control circuitry has typically no linear control characteristic.

In document WO 03/079548 a method is suggested to generate the exact local oscillator frequency on basis of an uncorrected reference oscillator by altering the division ratio of a Fractional-N-PLL (phase locked loop) circuitry that generates the local oscillator frequency on basis of the reference frequency of an uncorrected reference oscillator. However, in this solution, the exact reference frequency which is needed e.g. for processing of protocol timing and sampling of included Digital-to-Analog-Converters (DACs) and Analog-to-Digital-Converters (ADCs) cannot be provided in the mobile device.

Furthermore, in document U.S. Pat. No. 5,856,766, an exact local oscillator frequency is obtained by an apparatus on the basis of an uncorrected reference frequency by coupling both with a Fractional-N-PLL to which an information containing the initial frequency error of the local-oscillator is supplied to adapt the fractional division ratio in order to minimize the frequency error of the local oscillator. Further mixing or processing frequencies are obtained by providing further integer PLLs on basis of the exact local oscillator. This solution leads to the same problem, that the exact reference frequency itself is not generated, as mentioned above.

Thus, known frequency tracking mechanisms require corresponding control circuitry which involves costs and space, or do not supply any baseband or any output with the exact reference frequency.

It is an object of the present invention to provide an improved synchronization scheme, method and apparatus, by means of which an exact reference frequency can be generated without requiring any additional tracking or control circuitry for the reference frequency oscillator.

This object is achieved by a synchronization apparatus as claimed in claim 1 and by a synchronization method as claimed in claim 21.

Accordingly, synchronization of the reference frequency is accomplished by using a frequency error information which is used for converting the reference frequency to its exact frequency value also for a frequency conversion unit which converts, based on this information, the uncorrected reference frequency of the reference oscillator to the exact reference frequency. Due to the provision of the frequency conversion unit which is controlled by the correction control information derived from the frequency error, the frequency adjustment or tracking function of the output signal can be provided using the frequency conversion unit, so that the frequency of the reference oscillator itself does not have to be changed. Consequently, no external control means for frequency adjustment and/or tracking have to be provided.

Moreover, a strictly linear control characteristic is obtained due to the fact that the frequency conversion unit can be provided independent of any signal generating means, e.g., phase locked loop arrangement. Any modulations introduced in the voltage controlled oscillator VCO of the phase locked loop arrangement have no impact on the exact reference frequency that is the output signal, because the arrangement realizes decoupling.

Additionally, the correction control information is independent from the actually used radio channel, so that fast synchronization can be obtained even after switching to a new channel. The same frequency divider offset is, besides receive channels, also applicable for transmission channels. Then, the exact reference frequency is the reference for the generation of the transmit signal when a transmit section is provided.

As the exact reference frequency is not derived from the output signal of the PLL arrangement, the PLL arrangement does not have to be active when the exact reference frequency is required. This is advantageous in that a reduced current consumption can be achieved which will increase stand-by times.

The synchronization error may be determined based on a synchronization error between the output signal and the conversion signal generated by the signal generating means. Alternatively, the synchronization error may be determined based on a synchronization error between the output signal and the synchronization information.

The reference oscillator used for generating the uncorrected reference frequency may be a crystal or MEMS (Micro-Electro-Mechanical System) oscillator, and may be a non-controllable fixed-frequency oscillator. The predetermined nominal division ratio can be derived from the ratio between the nominal channel frequency, which is defined by the corresponding communication system, and the nominal reference frequency.

Furthermore, the control means may be connected to a programming interface for setting the channel control information and the correction control information. A change of the frequency can thus be achieved by reprogramming the phase locked loop arrangement and the frequency conversion means using the programming interface.

The correction control information may comprise a frequency correction addend which is independent from the transmission channel, and an independent conversion factor which is also independent from the transmission channel. Then, the frequency conversion means may comprise a series combination of a multiplier means for multiplying the reference frequency by a multiplication factor determined on the basis of the frequency correction addend and the conversion factor and a divider means for dividing the multiplied reference frequency by a division factor determined on the basis of the independent conversion factor. Additionally, the frequency conversion means may comprise filter means for limiting the spectral composition of the output of the divider means. Thereby, the spectral purity of the output signal of the frequency conversion means can be enhanced.

The multiplier means may be e.g. a kind of Fractional-N-PLL, integer-PLL, or other type of multiplication means.

The divider means may be e.g. a kind of integer divider, Fractional-N divider, integer divider or other type of division means.

The control means may be arranged to set the independent conversion factor to obtain an integer value of the multiplication factor. Alternatively the control means may be arranged to set the independent conversion factor to obtain an integer value of the division factor. As an substitute to the above programming option, the independent conversion factor can be hardwired in the apparatus, so that programming thereof is not required.

Additionally, switching means may be provided for connecting either the uncorrected reference frequency or the output of the frequency conversion means to an output of the synchronization apparatus. Thereby, at an initial start of the synchronization procedure, the uncorrected reference frequency may be switched by the switching means to a controlling unit for activation and initialization.

As an example, the output signal may be supplied to a baseband processing unit which comprises calculating means for calculating the synchronization error based on a frequency offset. The synchronization can thus be achieved by calculating the frequency offset at the baseband processing unit and setting the frequency correction addend for next step based thereon, e.g. via the programming interface.

Further advantageous modifications are defined in the dependent claims.

The present invention will now be described based on a preferred embodiment with reference to the accompanying drawings, in which.

The preferred embodiment will now be described based on a synchronization of a mobile terminal to a synchronization information or synchronization signal emitted by a cellular network.

Figure 1:
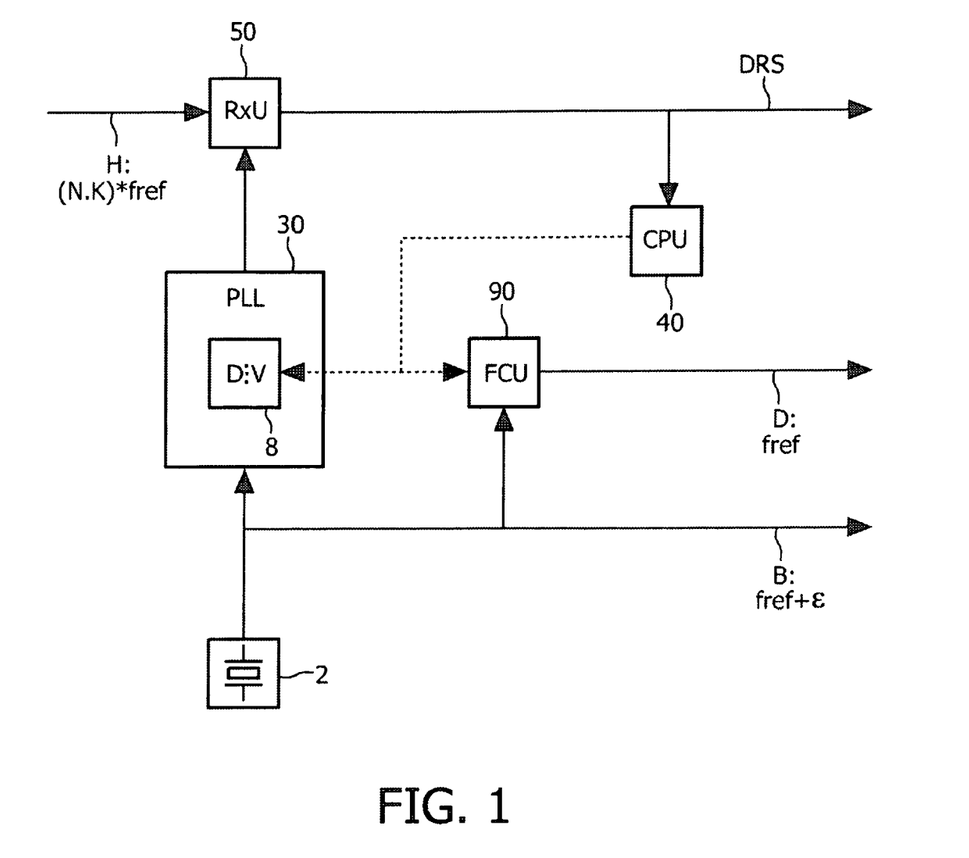
FIG. 1 shows a schematic block diagram of a synchronization scheme according to the present invention.

FIG. 1 shows a schematic block diagram indicating the synchronization mechanism underlying the preferred embodiment. The synchronization of the reference frequency in the mobile terminal or mobile user equipment is accomplished by deriving from a control information of a divider 8 of a phase locked loop (PLL) circuitry 30 a further control information for a frequency conversion unit 90. The PLL circuitry 30 is supplied with an uncorrected reference oscillator signal B. This uncorrected reference oscillator signal B for the phase locked loop circuitry 30 is generated by a simple crystal oscillator 2 having no means or circuitry for frequency control. The setting of the divider 8 and the frequency conversion unit 90 and their configuration is performed by a control unit or mechanism 40. This follows a certain sequence which enables the user equipment to synchronize its generated reference frequency $f_{ref}$ to a frequency information (N.k) *$f_{ref}$ or a frequency correction or synchronization information received from the cellular network by a corresponding receiver unit 50 to which the signal generated by the phase locked loop circuitry 30 is supplied e.g. for mixing or other synchronized receiving purposes.

The receiver unit 50 generates a digital receiving signal DRS which is further processed in a subsequent unit (not shown). As indicated in FIG. 1, the uncorrected reference frequency of the reference oscillator signal B generated by the crystal oscillator 2 has a frequency error ε which is compensated in the synchronized output signal D by a corresponding resulting frequency conversion factor set at the frequency conversion unit 90 by the control unit 40. Thereby, an output signal D with a synchronized or corrected exact reference frequency $f_{ref}$ can be obtained without requiring any adjustment of the crystal oscillator 2 itself. It is to be noted here, that the crystal oscillator 2 may be replaced by any suitable reference oscillator which generates a fixed frequency.

In the following, the above synchronization mechanism will be described in more detail based on a so-called "zero-IF-receiver" arrangement, which is a superheterodyne (superhet) receiver with an intermediate frequency (IF) of 0 Hz. This means that the received high frequency or radio frequency (RF) signal is directly converted into the baseband frequency, e.g., by a corresponding frequency conversion circuit. However, it is to be noted that the principle of the proposed synchronization mechanism can be applied to other receiver architectures as well, such as for example other superhet principles involving a non-zero IF.

In the figures, only those connections or control lines, respectively, are shown and indicated by corresponding symbols, which are relevant for the description of the preferred embodiment.

Figure 2:
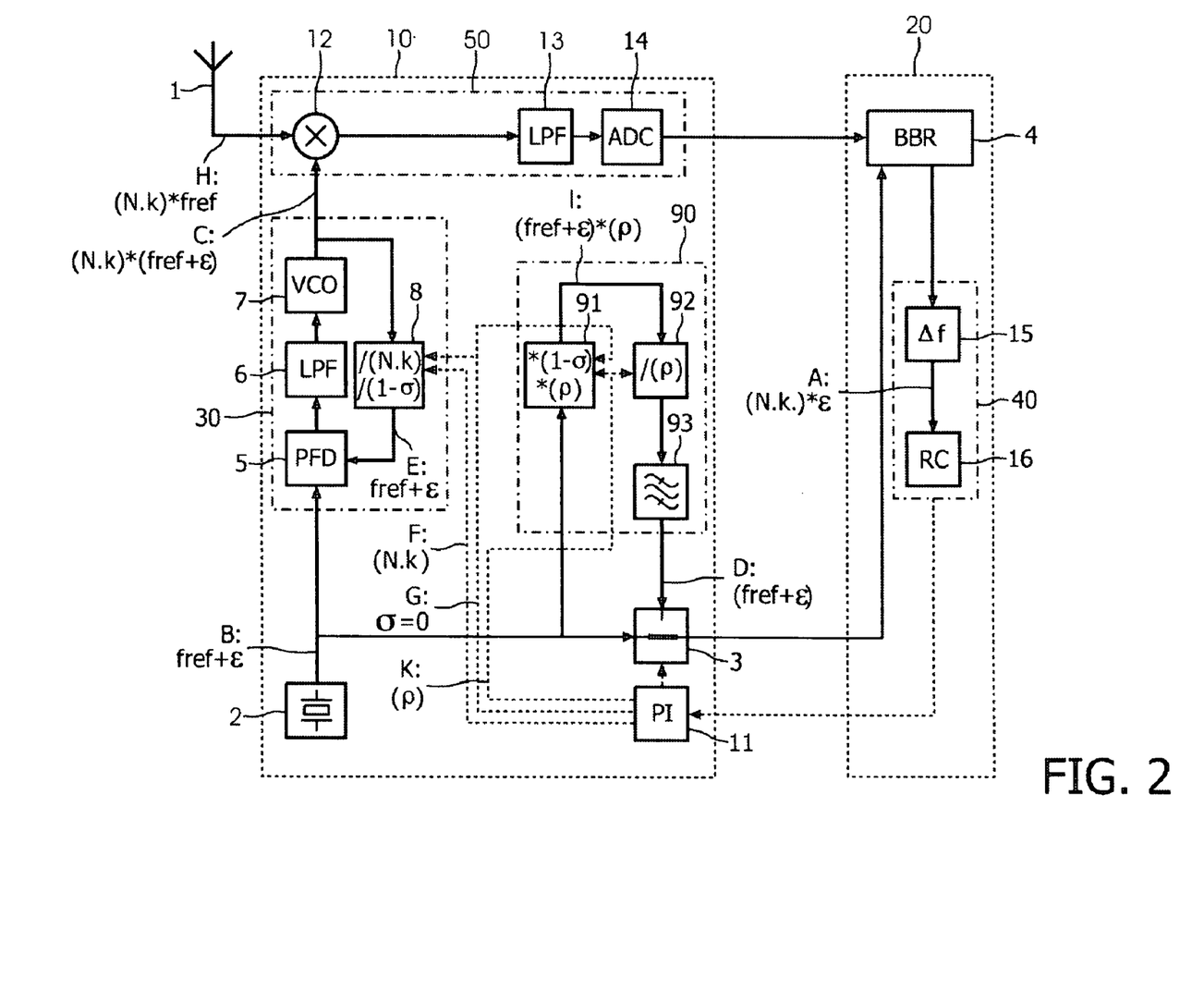
FIG. 2 shows a schematic block diagram of a mobile terminal with a synchronization mechanism according to the preferred embodiment in a situation directly after switching on the arrangement.

According to FIG. 2, an arrangement is proposed for receiving and synchronizing to a synchronization information emitted by a network. To achieve this, a synchronization signal H is received by means of an antenna 1, is converted by a subsequent receiver arrangement 10 into a baseband frequency, and is decoded and evaluated in a subsequent baseband processing unit 20. For frequency conversion, a mixer 12 is arranged in the receiver arrangement 10 following the connected antenna 1. The mixer 12 is followed by a low pass filter 13 for band limitation of the converted receiving signal, and by an analog-to-digital converter 14 for converting the converted receiving signal into a digital receiving signal. The conversion signal C for the mixer 12 is generated by a connected voltage-controlled oscillator 7, which is part of a phase locked loop arrangement 30. The phase locked loop arrangement 30 comprises further a PLL divider 8, for example a fractional-N-frequency divider, a phase-frequency comparator 5, and a loop filter 6.

Additionally, a reference crystal oscillator 2 serves to generate a reference oscillator signal B with an uncorrected reference frequency, which is used as phase comparison frequency supplied to the phase-frequency comparator 5. The phase locked loop arrangement 30 serves to converge the frequency of the frequency-divided signal E to the uncorrected reference frequency of the reference oscillator signal B when the steady state has been reached.

The reference crystal oscillator 2 does not require any control circuit for frequency variation or frequency tracking, respectively. Here, the required exact reference frequency is designated by $f_{ref}$ and its absolute precision is predefined by the respective communication system. In contrast thereto, the uncorrected reference frequency of the reference oscillator signal B of the reference crystal oscillator 2 deviates from the exact reference frequency $f_{ref}$ by a reference frequency error $\epsilon$.

According to the preferred embodiment, a frequency conversion unit 90 is connected to the output of the crystal-oscillator 2. The frequency conversion unit 90 converts the uncorrected reference frequency of the reference oscillator signal B to the corrected frequency of the output signal D of the frequency conversion unit 90. This conversion is determined by the resulting frequency conversion factor ($\kappa$).

$$\kappa = \frac{f_D}{f_B} \quad \{1\}$$

where $f_D$ designates the corrected frequency of the output signal D and $f_B$ designates the uncorrected reference frequency of the reference oscillator signal B. In the same manner in the following, all symbols being f[index signal name] designate the frequency of the signal. The frequency conversion unit 90 consists of a series combination of a coupled multiplier 91, a coupled divider 92 and an output signal filter 93. The coupled multiplier 91 converts the reference oscillator signal B to a converted frequency signal I. And the coupled divider 92, in combination with the subsequent output signal filter 93, converts the converted frequency signal I to the output signal D of the frequency conversion unit 90.

The function of the output signal filter 93 is to limit the spectral composition and to limit the noise bandwidth of the output signal of the coupled divider 92. So, the spectral purity of the output signal D of the frequency conversion unit 90 is enhanced. The filter characteristic of the output signal filter 93 may be a bandpass or lowpass characteristic.

The division factor of the PLL-divider 8 is a combination of two logical division ratios, a nominal division ratio N.k and a correction division ratio (1-σ). In particular, the nominal division ratio N.k can be derived from the ratio of the mobile radio channel frequency of the received signal to the nominal reference frequency. Whereas the correction division ratio (1-σ), in particular the frequency correction addend σ, is used to obtain the exact needed frequency for the voltage controlled oscillator 7. This frequency relation between the frequency-divided signal E and the conversion signal C can be expressed as follows:

$$\frac{f_E}{f_C} = \frac{1}{(N \cdot k) * (1 - \sigma)}$$

A last-programmed indexed reference designator frequency correction addend $\sigma_{-1}$ is used to distinguish from the frequency correction addend $\sigma_{+1}$ for the next step and to bring both in a timely relationship.

Additionally, the frequency multiplication factor μ of the coupled multiplier 91 consists of the above mentioned correction division ratio (1-σ) supplemented by an independent conversion factor ρ according to following equation {2}.

$$\mu = \frac{f_I}{f_B} = \rho * (1 - \sigma) \quad \{2\}$$

The frequency division factor ζ of the coupled divider 92 consists of the above mentioned independent conversion factor ρ that is also part of the programming of the coupled multiplier 91. This is expressed in the following equation {3}:

$$\zeta = \frac{f_D}{f_I} = \frac{1}{\rho} \quad \{3\}$$

The dividing ratios or conversion factors N.k, (1-σ) and ρ are set by a programming interface 11 which is connected to the PLL divider 8 via a control connection F for programming of the nominal division ratio N.k, and to the PLL divider 8 and the coupled multiplier 91 via another control connection G for programming of the frequency correction addend σ, and to the coupled multiplier 91 and the coupled divider 92 via a further control connection K for programming of the independent conversion factor ρ. The setting procedure of the programming interface 11 is controlled by a radio controller 16 arranged in the baseband processing unit 20.

Furthermore, a selection switch 3 is controlled by the programming interface 11. The selection switch 3 either connects the reference oscillator signal B of the reference crystal oscillator 2 or the output signal D of the frequency conversion unit 90 to the baseband processing unit 20, particularly to a baseband receiver 4 provided in the baseband processing unit 20.

The baseband receiver 4 receives the digital receiving data from the analog-to-digital converter 14 of the receiver arrangement 10 for post-processing and decoding. A frequency offset calculator 15 is connected to the baseband receiver 4 where the synchronization information originally emitted by the network is decoded. The frequency offset calculator 15 calculates a frequency offset information A based on the last setting of the nominal division ratio N.k.

In mathematical terms, the frequency offset information A corresponds to the difference between the frequency $f_H$ of the synchronization information H and the frequency $f_C$ of the conversion signal C applied to the mixer 12 for conversion to the baseband frequency. This can be expressed as follows:

$$A = f_C - f_H \quad \{4\}$$
$$f_C = (N \cdot k) * (1 - \sigma_{-1}) * (f_{ref} + \varepsilon)$$
$$f_H = (N \cdot k) * f_{ref}$$
$$A = (N \cdot k) * [\varepsilon - \sigma_{-1} * (f_{ref} + \varepsilon)]$$

$$\varepsilon = \frac{\frac{A}{(N \cdot k)} + \sigma_{-1} * f_{ref}}{1 - \sigma_{-1}} \quad \{5\}$$

For achieving and maintaining the conversion signal C generated by the voltage-controlled oscillator 7 at its exact frequency, the frequency correction addend σ of the division factor of the PLL divider 8 is continuously tracked based on the obtained frequency offset information A.

As this continuously tracked frequency correction addend σ is also updated in the coupled multiplier 91, the generated output signal D will have the exact reference frequency, even when the uncorrected reference frequency of the reference oscillator signal B drifts, caused by e.g. temperature variations.

The situation shown in FIG. 2 corresponds to a state directly after switching on the power supply to the arrangement. At the beginning of the synchronization process, the uncorrected reference frequency of the reference oscillator signal B of the reference crystal oscillator 2 with its reference frequency error ϵ is connected via the selection switch 3 to the baseband processing unit 20, so that the baseband processing unit 20 can start up. This is required due to the fact that the frequency conversion unit 90 does not deliver an output signal D before the radio controller 16 of the baseband processing unit 20 has been initialized.

Afterwards, the nominal division ratio N.k of the PLL divider 8 is programmed as a channel control information via the control connection F, and the frequency correction addend σ of the PLL divider 8 and the coupled multiplier 91 is programmed to zero via the control connection G (i.e., σ=0), and the independent conversion factor ρ of the coupled multiplier 91 and the coupled divider 92 is programmed to its constant value. Thereby, in the steady state of the phase locked loop arrangement 30, the frequencies of the signals B, D, and E are all equal to the value $f_{ref}+\epsilon$.

The conversion signal C required for frequency conversion at the mixer 12 is obtained from the uncorrected reference frequency of the reference oscillator signal B, which is multiplied by the nominal division ratio N.k and the correction division ratio (1-σ) of the PLL divider 8 by using the phase locked loop arrangement 30 consisting of blocks 5, 6, 7 and 8, while the last-programmed frequency correction addend $\sigma_{-1}$ is set to zero and therefore the correction division ratio $(1-\sigma_{-1})$ is one. Thus, the frequency of the conversion signal C amounts to:

$$f_C=(N.k)*(f_{ref}+\epsilon).$$

The frequency error information A obtained at the frequency offset calculator 15 of the baseband processing unit 20 amounts to (N.k)*ϵ. This corresponds to the reference frequency error ϵ at the reference crystal oscillator 2 multiplied by the nominal division ratio (N.k).

The contributors to the frequency multiplication factor μ especially the independent conversion factor ρ can be chosen in order that the frequency multiplication factor μ results in an integer number.

Alternatively, the resulting frequency conversion factor κ especially the independent conversion factor ρ can be chosen in order that the resulting frequency conversion factor κ results in an integer number.

In general, the independent conversion factor ρ need not necessarily be programmed. It can also be hardwired.

For principal functionality the independent conversion factor ρ can be of every rational or irrational number. As an example, the independent conversion factor ρ can be chosen to be significant higher than "1" in order to obtain best performance of output signal with respect to noise and spurs generated by the frequency conversion unit 90.

Ultimate target of the arrangement according to the preferred embodiment is that the corrected reference frequency of the output signal D of the frequency conversion unit 90 and thus the frequency forwarded to the baseband processing unit 20 exactly corresponds to the exact reference frequency, i.e., the frequency of the output signal D amounts to $f_{ref}$.

Furthermore, it shall be achieved that the mixer 12 is operated by the exact nominal conversion frequency, such that the frequency of the conversion signal C shall amount to $f_{ref}*$(N.k). In view of the fact that the signals C and B=E are linked by the division ratio (N.k)*(1-σ) of the PLL-divider 8, the frequency of the conversion signal C amounts to (N.k)*(1-σ) *$(f_{ref}+\epsilon)$.

This leads to the following expressions, when synchronization of the signal C is forced:

$f_C=(N.k)*(1-\sigma)*f_E$ in general $f_C=f_{ref}*(N.k)$ in case of synchronization $$f_{ref}*(N\cdot k) = (N\cdot k)*(1-\sigma)*(f_{ref}+\varepsilon) \quad \{6\}$$
$$f_{ref} = (1-\sigma)*(f_{ref}+\varepsilon)$$
$$\sigma_{+1} = \frac{\varepsilon}{f_{ref}+\varepsilon}$$
$$\varepsilon = \frac{\sigma_{-1}}{1-\sigma_{-1}}*f_{ref} \quad \{7\}$$

In the above equations {6} and {7}, it is advantageous that the calculations from the last-programmed frequency correction addend $\sigma_{-1}$ to the frequency error ϵ and from frequency error ϵ to the next-step frequency correction addend $\sigma_{+1}$, that are required for generation and maintaining of the exact reference frequency of the output-signal D do not depend on the nominal division ratio N.k and thus do not depend on the selected mobile radio channel. This means that synchronization can be upheld even during a change of the mobile radio channel without reprogramming the frequency correction addend σ.

It shall be mentioned that all multiplicative combinations of division, respectively multiplication ratios like in PLL-divider 8 and coupled multiplier 91 might only be for logical and software-programming representation. This means that these parts might be physically realized as one Fractional-N divider (block 8) respectively multiplier (block 91) with one fractional division ratio.

Figure 3:
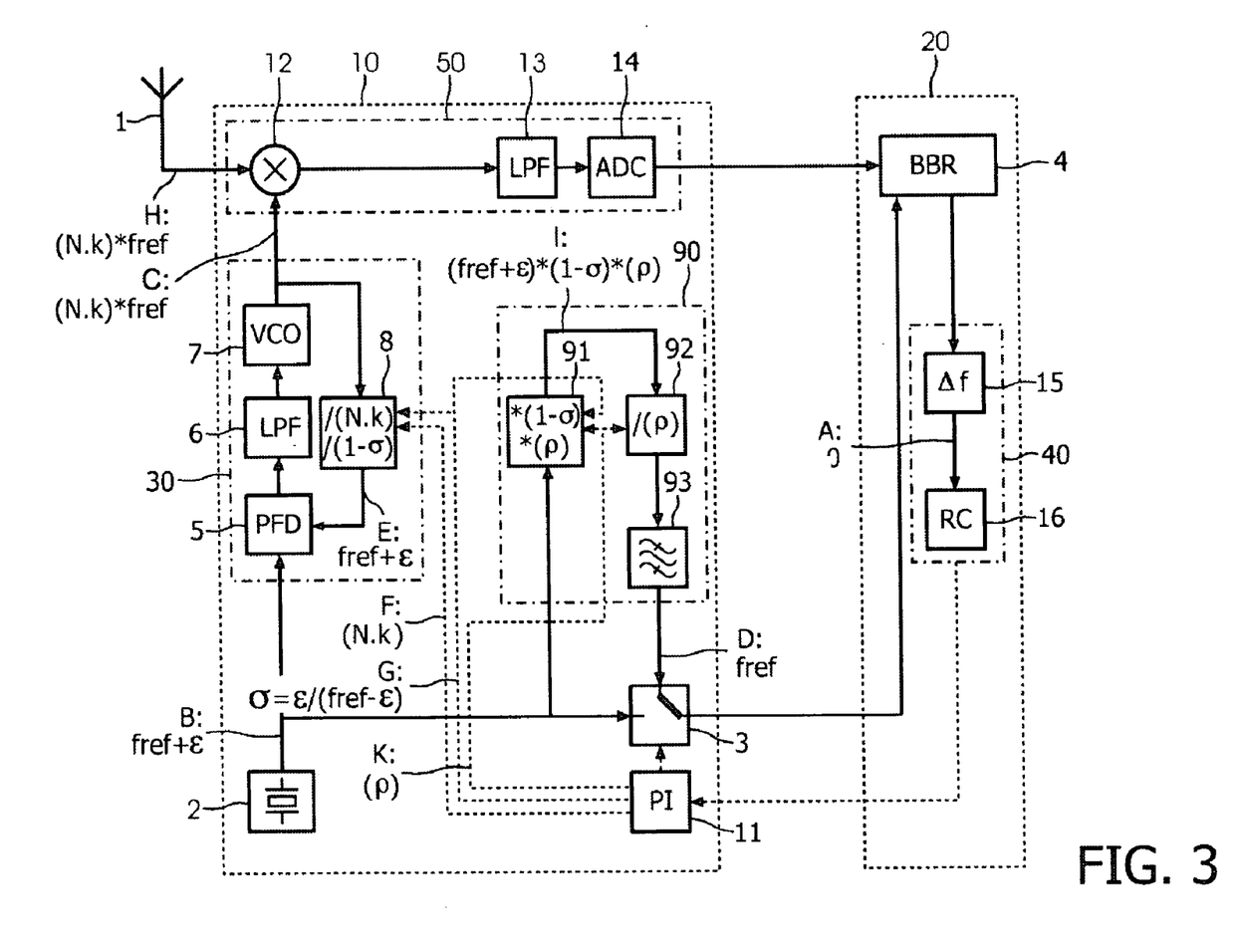
FIG. 3 shows the mobile terminal of FIG. 2 in a situation after a synchronized state has been reached.

FIG. 3 shows the block diagram of FIG. 2 in a situation when synchronization has been reached. This means that the complete apparatus generates the exact reference frequency of the output signal D that is fed through the switch 3 to the baseband processing unit 20 and possibly to some other parts e.g. a GPS unit that requires this exact reference frequency. Also, the conversion signal C is at its exact frequency.

As explained above in connection with the ultimate target, the reference frequency error ϵ can be derived, using equation {5} at the baseband processing unit 20. Therefore, the frequency offset information A is processed, using equation {5}, due to the fact that the nominal division ratio N.k is known by the set radio channel and the last-programmed frequency correction addend $\sigma_{-1}$ is known from the last programming and therefore valid for the conditions at which the actual frequency offset information A was caused. Here, $\sigma_{-1}$ is either 0 in the initial state or known from a previous setting. Thus, the frequency correction addend $\sigma_{+1}$ for the next step of the PLL-divider 8 and subsequent steps can be programmed or set according to equation {6}.

After the phase locked loop arrangement 30 has reached its steady state, the frequency of the conversion signal C exactly corresponds to the value $f_{ref}*$(N.k), which corresponds to the exact conversion frequency of the mixer 12. As the frequency of the conversion signal C comprises the two components (N.k)*$f_{ref}$ and (N.k)*ϵ, the second component which corresponds to the frequency offset information A thus reaches zero value at this stage, i.e. $(N.k)*\epsilon=0$. The programming interface 11 controls the selection switch 3 to connect the output signal D of the frequency conversion unit 90 to the baseband processing unit 20. This means that the exact reference frequency $f_{ref}$ is used in the receiver arrangement 10 as well as in the baseband processing unit 20, independent from the reference frequency error $\epsilon$ of the uncorrected reference frequency of the reference oscillator signal B.

Due to for example temperature changes within the mobile terminal, the reference frequency error $\epsilon$ changes with time. Thus, during operation, the frequency offset information A of the frequency offset calculator 15 may temporarily deviate from zero. In response to this deviation, a reprogramming of the frequency correction addend σ is performed in the PLL divider 8 and in the coupled multiplier 91 in order to set the frequency offset information A to zero, which corresponds to a reference frequency tracking function for compensating any reference frequency error $\epsilon$.

In the description of the preferred embodiment, any temporary changes of the synchronization information emitted by the network and received by the mobile terminal, which may be caused by Doppler effects and frequency deviations due to frequency offsets at the counterpart station (e.g. base station) cannot be distinguished from changes of the uncorrected reference frequency and are regarded to be represented by the reference frequency error $\epsilon$.

A benefit of this arrangement is that, after the frequency correction addend is obtained, the RF section build by the phase locked loop arrangement 30 and the receiver unit 50 need no longer be active for generation of the exact reference frequency of the output signal D. This is valid as long as the frequency error $\epsilon$ does not drastically change. This helps to save current or power and therefore to increase stand-by time.

A further benefit of this arrangement is that the voltage controlled oscillator 7 can be modulated without coupling or transferring frequency changes to the output signal D.

Figure 4A:
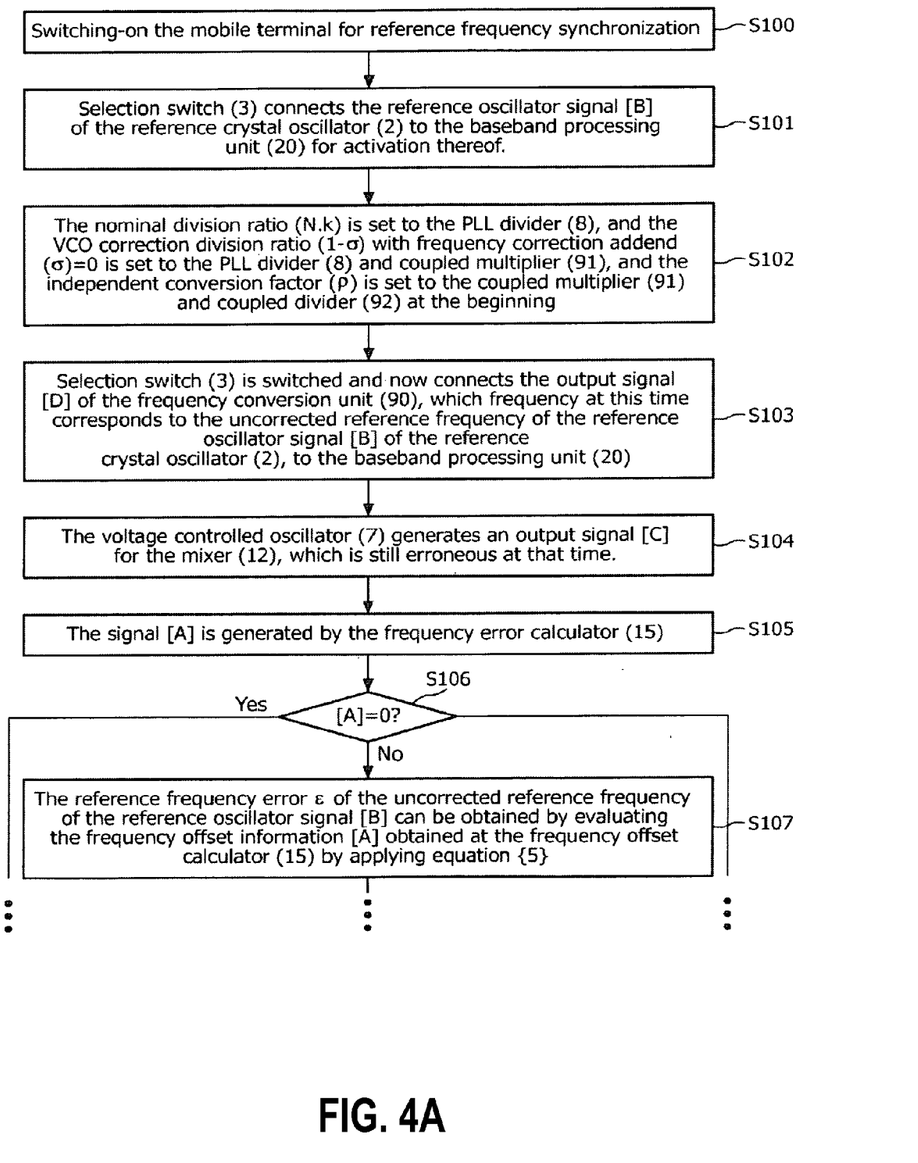
FIGS. 4A and 4B show a flow diagram relating to a transfer procedure from the initial state indicated in FIG. 2 to the synchronized state indicated in FIG. 3.
Figure 4B:
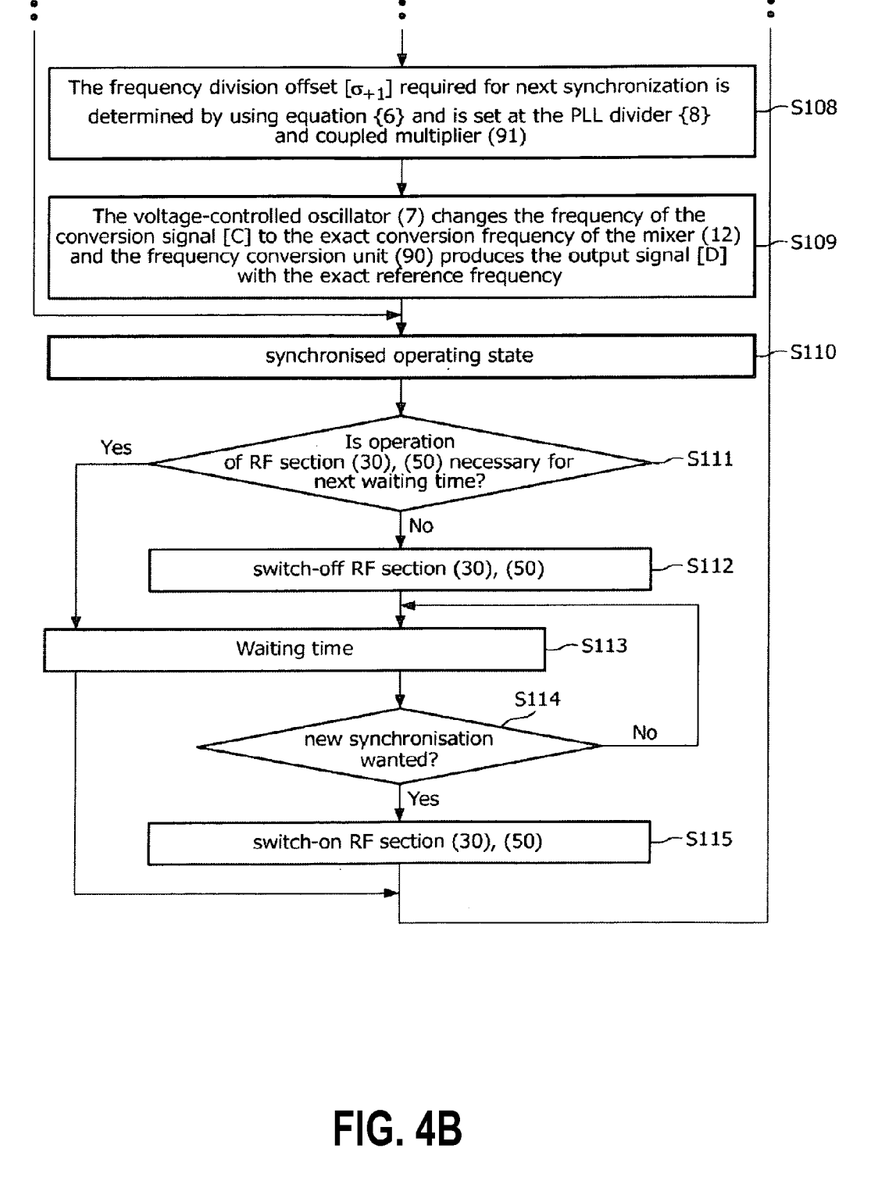

FIG. 4 shows a schematic flow diagram relating to the change or transfer procedure from the initial state according to FIG. 2 to the synchronized state according to FIG. 3. In particular, FIG. 4 depicts a way in which the reference frequency is tracked during the operation of the mobile terminal.

In step S100, the mobile terminal is switched on for reference frequency synchronization. Then, in step S101 the selection switch 3 connects the reference oscillator signal B of the reference crystal oscillator 2 to the baseband processing unit 20 for activation thereof. Subsequently, in step S102, the PLL divider 8 is set or programmed to the nominal division ratio N.k, and the correction division ratio (1-σ) with frequency correction addend (σ) equal to 0 is set to the PLL divider 8 and the coupled multiplier 91, and the independent conversion factor ρ is set to the coupled multiplier 91 and the coupled divider 92 at the beginning. In step S103, the selection switch 3 is switched and now connects the output signal D of the frequency conversion unit 90, which frequency at this time corresponds to the uncorrected reference frequency of the reference oscillator signal B of the reference crystal oscillator 2, to the baseband processing unit 20. In step S104, the voltage-controlled oscillator 7 generates a conversion signal C for the mixer 12, which is still erroneous at this initial point in time.

In step S105, the frequency error information A is generated by the frequency error calculator 15. In the following decision step S106, it is checked whether the frequency offset information A is zero or not. If the frequency offset information A is zero, the procedure jumps to step S110, where a synchronized operating state is assumed and a waiting time with conditions that depend on decisions made in step S111 is started. Details and following steps are given within the description of the other branch of the flow diagram.

If it is determined in step S106 that the frequency offset information A is not equal zero it is proceeded with step S107. As indicated in step S107, the reference frequency error $\epsilon$ of the uncorrected reference frequency of the reference oscillator signal B can be obtained by evaluating the frequency offset information A obtained at the frequency offset calculator 15 by applying equation {5}.

The frequency correction addend $\sigma_{+1}$ required for next synchronization step is determined by using equation {6} and is set at the PLL divider 8 and coupled-multiplier 91 in step S108. Then, in step S109, the voltage-controlled oscillator 7 changes the frequency of the conversion signal C to the exact conversion frequency of the mixer 12 and the frequency conversion unit 90 produces the output signal D with the exact reference frequency. Consequently in the following step S110 a synchronized operating state is entered.

In the following decision step S111, it is checked whether operation of the RF section (phase locked loop arrangement 30 and receiver unit 50) is necessary for the next waiting time. If so, the waiting time is initiated in step S113 and after the waiting time, the procedure jumps back to step S105.

If it is determined in step S111 that operation of the RF section is not necessary, the RF section is switched of in step S112 and the following step is step S113, which initiates a waiting time. After expiry of the waiting time, a decision is made in step S114 whether a new synchronization is wanted. If not, the procedure jumps back to step S113 and a new waiting cycle is initiated. If a new synchronization is wanted, the RF section is switched on in step S115 and the procedure jumps back to step S105.

In general, the present invention provides the advantage that physical, discrete, analog circuits for frequency tracking at the reference crystal oscillator circuit, such as tuning elements filter and decoupling circuits, can be dispensed with, which leads to savings in costs and space.

Besides, there is the advantage that the RF section can be switched off, after the correction control information was generated.

A further benefit is, that the output signal is decoupled from the voltage-controlled oscillator 7. So the voltage controlled oscillator 7 can be modulated, without having any influence on the spectral quality of the exact reference frequency of the output signal D as output signal.

Finally, the above preferred embodiment as depicted in FIGS. 2, 3 and 4 provides the advantage that the frequency correction addend σ is independent from the set mobile radio channel and independent from the operation as receiver or transmitter.

In summary, an apparatus and method for providing synchronization of an output signal D to a synchronization information or synchronization signal H has been described, wherein the synchronization is accomplished by providing coupling of a correction control information that controls a signal generating means, such as a phase locked loop arrangement 30 or a direct digital synthesis arrangement, to its exact frequency to a frequency conversion unit 90 that converts an uncorrected reference frequency to a correct or exact reference frequency. Thereby the uncorrected reference frequency, provided by a simple crystal oscillator 2 without any means for frequency control, can be used in the radio communication apparatus. This is achieved by the proposed apparatus and method, that generates the output signal D with an exact reference frequency that is used internally in the baseband processing unit 20 and moreover can be fed to external devices. Furthermore, with the present apparatus and method, a conversion signal C is generated on its exact frequency, that is used in the receiver arrangement 10, especially in mixer 12. The setting of the phase locked loop arrangement 30 and the frequency conversion unit 90 can be done in a predetermined sequence which enables a user equipment to synchronize its reference frequency to a received frequency correction information emitted by a communication network.

It is noted that the present invention is not restricted to the above preferred embodiment and generalized embodiment, but can be applied in any receiver and/or receiver-transmitter arrangement, such as for example superheterodyne receivers, where a clock frequency, reference frequency or other control frequency, which is derived in a terminal device or other device, is synchronized to a comparison frequency derived from or contained in a synchronization information broadcast from a network or made available by other communication media. As alternative to the phase locked loop arrangement 30, the conversion signal C can also be generated by use of other signal generating means, like for example direct digital synthesis arrangement. Here, also, in an earlier step the channel control information is used for generation of the uncorrected conversion signal C. In a later step, the channel control information together with the correction control information is used in order to obtain generation of the exact conversion signal C.

The synchronization error not necessarily has to be derived from the difference between the frequency $f_H$ of the synchronization information H and the frequency $f_C$ of the conversion signal C applied to the mixer 12 for conversion to the baseband frequency. As an alternative option, the synchronization may be derived from a comparison of the frequency $f_H$ of the synchronization information H with the frequency $f_D$ of the output signal D.

As a further alternative option, the synchronization may be derived from a comparison of the frequency $f_H$ of the synchronization information H with the frequency $f_B$ of the reference oscillator signal B.

Specific examples for implementing the present invention are terminal devices for use in the Global System for Mobile communication (GSM), the Universal Mobile Communications System (UMTS), Code Division Multiple Access (CDMA) systems, wireless networks such as those specified in IEEE 802.11, IEEE 802.15, IEEE 802.16, Digital Enhanced Cordless Telephone (DECT) systems, Bluetooth systems, and/or any other radio communication standard. The preferred embodiment may thus vary within the scope of the attached claims.

The invention claimed is:

1. A synchronization apparatus for providing synchronization of an output signal to a synchronization information, said apparatus comprising:
   a) frequency conversion means for converting a reference frequency into a corrected reference frequency, said reference frequency being used for processing said synchronization information; and
   b) control means for generating a correction control information based on a determined synchronization error of said synchronization apparatus with respect to said synchronization information,
   c) wherein said control means is arranged to supply said correction control information to said frequency conversion means to correct said reference frequency based on said correction control information.

2. An apparatus according to claim 1, wherein said synchronization error is determined based on a synchronization error between said output signal and said synchronization information.

3. An apparatus according to claim 1, wherein said synchronization error is determined based on synchronization error between said reference frequency and said synchronization information.

4. An apparatus according to claim 1, further comprising signal generating means to which said reference frequency is supplied for generating a conversion signal, wherein said synchronization error is determined based on a synchronization error between said conversion signal and said synchronization information.

5. An apparatus according to claim 4, wherein said signal generating means is programmed with a channel control information in order to set a predetermined nominal division ratio and wherein said correction control information is supplied to said signal generating means so as to set a frequency correction division ratio for said signal generating means.

6. An apparatus according to claim 4, wherein said signal generating means comprises a phase locked loop arrangement or a direct digital synthesis arrangement.

7. An apparatus according to claim 1, further comprising a reference oscillator for generating said reference frequency.

8. An apparatus according to claim 7, wherein said reference oscillator is a non-controlled fixed-frequency oscillator.

9. An apparatus according to claim 8, wherein said fixed-frequency oscillator is a crystal oscillator.

10. An apparatus according to claim 8, wherein said fixed-frequency oscillator is a MEMS oscillator.

11. An apparatus according to claim 1, wherein said reference frequency is the basis for a channel conversion signal of a receiver, and wherein said nominal division ratio is derived from a ratio between a channel frequency of said channel signal and a nominal reference frequency.

12. An apparatus according to claim 5, wherein said control means is connected to a programming interface for setting said correction control information and said channel control information.

13. An apparatus according to claim 1, wherein said correction control information comprises at least one of a frequency correction addend, which is independent from the reception or transmission channel, and an independent conversion factor.

14. An apparatus according to claim 13, wherein said frequency conversion means comprises a series combination of a multiplier means and a divider means.

15. An apparatus according to claim 14, wherein said multiplier means is arranged for multiplying said reference frequency by a multiplication factor determined on the basis of said frequency correction addend, which is derived from said correction control information, and an independent conversion factor, and wherein said divider means is arranged for dividing said multiplied reference frequency by a division factor determined on the basis of said independent conversion factor.

16. An apparatus according to claim 1, wherein said frequency conversion means comprises filter means for limiting the spectral composition of the output signal of the said frequency conversion means.

17. An apparatus according to claim 13, wherein said control means O is arranged to set said independent conversion factor to obtain an integer value of said multiplication factor.

18. An apparatus according to claim 13, wherein said control means is arranged to set said independent conversion factor to obtain an integer value of said division factor.

19. An apparatus according to claim 13, wherein said independent conversion factor is hardwired in said apparatus.

20. An apparatus according to claim 1, further comprising switching means for supplying either said reference frequency or an output of said frequency conversion means to an output of said synchronization apparatus or to a baseband processing unit.

21. An apparatus according to claim 1, wherein said output signal is supplied to a baseband processing unit.

22. An apparatus according to claim 20, wherein said baseband processing unit comprises calculation means for calculating said synchronization error based on a frequency offset.

23. A synchronization method for providing synchronization of an output signal to a synchronization information, said method comprising the steps of:
  a) converting a reference frequency into a corrected reference frequency, said reference frequency being used for processing said synchronization information;
  b) generating a correction control information based on a determined synchronization error of said synchronization apparatus with respect to said synchronization information; and
  c) using said correction control information in said converting step to correct said reference frequency based on said correction control information.

24. A method according to claim 23, wherein said synchronization error is determined based on a synchronization error between said output signal and said synchronization information.

25. A method according to claim 23, wherein said synchronization error is determined based on a synchronization error between said reference frequency and said synchronization information.

26. A method according to claim 23, further comprising an earlier step of supplying said reference frequency to a signal generating means that generates a conversion signal on the basis of said reference frequency, wherein the said conversion signal is based on a channel control information, and a later step in which said conversion signal is based on said channel control information and said correction control information, wherein said correction control information is determined based on a synchronization error between said conversion signal and said synchronization information.

27. A method according to claim 26, where said signal generating means comprises a phase locked loop arrangement or a direct digital synthesis arrangement, and wherein said channel control information is used in said earlier step to set a predetermined nominal division ratio in said phase locked loop arrangement or said direct digital synthesis.

28. A method according to claim 22, further comprising the steps of supplying said reference frequency to a baseband processing unit during an initial operating phase of said baseband processing unit, and supplying said output signal to said baseband processing unit after correction of said reference frequency.

29. A receiver device comprising a synchronization apparatus as claimed in claim 1.

30. A transceiver device comprising a synchronization apparatus as claimed in claim 1.

31. A wireless electronics device comprising a synchronization apparatus as claimed in claim 1.

32. A receiver device in which a synchronization method as claimed in claim 23 is used.

33. A transceiver device in which a synchronization method as claimed in claim 23 is used.

34. A wireless electronics device in which a synchronization method as claimed in claim 23 is used.

* * * * *